(12) United States Patent
Chen et al.

(10) Patent No.: US 7,046,552 B2
(45) Date of Patent: *May 16, 2006

(54) FLASH MEMORY WITH ENHANCED PROGRAM AND ERASE COUPLING AND PROCESS OF FABRICATING THE SAME

(75) Inventors: Chiou-Feng Chen, Santa Clara, CA (US); Prateep Tuntasood, Santa Clara, CA (US); Der-Tsyr Fan, Hsinchu (TW)

(73) Assignee: Actrans System Incorporation, USA, Sunnyvale, CA (US)

( * ) Notice: Subject to any disclaimer, the term of this patent is extended or adjusted under 35 U.S.C. 154(b) by 73 days.

This patent is subject to a terminal disclaimer.

(21) Appl. No.: 10/802,253

(22) Filed: Mar. 17, 2004

(65) Prior Publication Data

US 2005/0207199 A1    Sep. 22, 2005

(51) Int. Cl.
*G11C 16/04* (2006.01)
(52) U.S. Cl. ............... 365/185.17; 365/185.29; 257/314
(58) Field of Classification Search ........... 365/185.33, 365/185.29, 185.17; 257/314, 315, 316, 257/317

See application file for complete search history.

(56) References Cited

U.S. PATENT DOCUMENTS

| 6,091,104 | A | | 7/2000 | Chen | |
|---|---|---|---|---|---|
| 6,486,509 | B1 | * | 11/2002 | Van Houdt | 257/319 |
| 6,818,512 | B1 | * | 11/2004 | Hsieh | 438/267 |
| 6,861,700 | B1 | * | 3/2005 | Guterman et al. | 257/321 |
| 6,992,929 | B1 | * | 1/2006 | Chen et al. | 365/185.17 |

* cited by examiner

*Primary Examiner*—Tuan T. Nguyen
*Assistant Examiner*—Hien Nguyen
(74) *Attorney, Agent, or Firm*—Edward S. Wright

(57) ABSTRACT

Self-aligned split-gate flash memory cell array and process of fabrication in which erase and select gates are positioned on opposite sides of stacked floating and control gates, with source regions in the substrate beneath the erase gates, bit line diffusions which are partially overlapped by select gates at the ends of the rows of the cells. The floating and control gates are self-aligned with each other, and the erase and select gates are split from but self-aligned with the stacked gates. With the floating gates surrounded by the other gates and the source regions, high voltage coupling for both programming and erase operations is significantly enhanced. The memory cells are substantially smaller than prior art cells, and the array is biased so that all of the memory cells in it can be erased simultaneously, while programming is bit selectable.

21 Claims, 7 Drawing Sheets

Fig. 1 - Prior art

FLASH MEMORY WITH ENHANCED PROGRAM AND ERASE COUPLING AND PROCESS OF FABRICATING THE SAME

BACKGROUND OF THE INVENTION

1. Field of Invention

This invention pertains generally to semiconductor memory devices and, more particularly, to a self-aligned split-gate flash memory and process of fabricating the same.

2. Related Art

Nonvolatile memory is currently available in several forms, including electrically programmable read only memory (EPROM), electrically erasable programmable read only memory (EEPROM), and flash EEPROM. Flash memory has been widely used for high volume data storage in devices such as memory cards, personal digital assistants (PDA's), cellular phones, and MP3 players. Such applications require high density memory, with smaller cell size and reduced cost of manufacture.

In general, there are two basic types of nonvolatile memory cell structures: stack-gate and split-gate. The stack-gate flash memory cell usually has a bit line contact, a source region, a floating gate, and a control gate, with the control gate being positioned directly above the floating gate. In a split-gate cell the control gate is still positioned above the floating gate, but it is offset laterally from it. The fabrication process for a stack-gate cell is generally simpler than that for a split-gate cell. However, a stack-gate cell has an over-erase problem which a split-gate cell does not have. This problem is commonly addressed by maintaining the threshold voltage of the cell in a range of about 1.0–2.0 volts after an erase cycle, which adds complexity to the circuit design.

Although a split-gate memory cell has no over erase problem, it generally includes an additional gate known as a select gate. Such cells are typically fabricated in double-poly or triple-poly processes which involve relatively complex processing steps. In addition, split-gate cells are generally larger than stack-gate cells. Nevertheless, because of the relatively simple circuit design which is possible when there is no over-erase problem, split-gate cells are used widely, particularly in embedded nonvolatile memory applications.

FIG. 1 illustrates a split-gate, self-aligned flash memory cell 16 which is described in detail in U.S. Pat. No. 6,091, 104. This cell has a silicon substrate 17, with drain and source regions 18, 19 formed in a channel region 21. A floating gate 22 and a control gate 23 are formed above the channel region, with a gate oxide 24 between the substrate and the floating gate, and a dielectric film 26 between the floating gate and the control gate. A select gate 27 is formed to one side of the floating gate and control gate, with an oxide layer 28 between the select gate and the substrate, a dielectric film 29 between the select gate and the control gate, and another dielectric film 30 between select gate and the floating gate.

In the program mode, control gate 23 is biased at a high positive voltage (e.g., 10–12 volts), the source at another high positive voltage (e.g., 6–8 volts), select gate at a lower positive voltage (e.g., 1–2 volts), and the drain at 0 volts. This establishes an electric field across off-gate channel region 25 between the floating gate and select gate, which initiates hot electron injection, with electrons migrating from the channel region to the floating gate.

In one erase mode, a negative voltage of about –10 volts is applied to control gate, a positive voltage of about 7 volts is applied to the select gate, and the source and drain are left floating. The strong electric field thus created across inter-poly dielectric film 30 initiates Fowler-Nordheim tunneling, with electrons migrating from the floating gate to the select gate. In another erase mode, a negative voltage of about –10 volts is applied to control gate, a positive voltage of about 7 volts is applied to the source, and the drain and select gate are left floating. The strong electric field thus created across gate oxide 24 initiates Fowler-Nordheim tunneling, with electrons migrating from the floating gate to the source.

As fabrication processes improve and geometries get smaller, e.g. tens of nanometers, it is difficult to form a high-voltage coupling ratio which is sufficient for program and erase operations while keeping cell size small and meeting stringent reliability requirements such as 10-year data retention and 1,000,000 cycling operations between failures.

OBJECTS AND SUMMARY OF THE INVENTION

It is in general an object of the invention to provide a new and improved semiconductor device and process for fabricating the same.

Another object of the invention is to provide a semiconductor device and process of the above character which overcome the limitations and disadvantages of the prior art.

These and other objects are achieved in accordance with the invention by providing a self-aligned split-gate flash memory cell array and process of fabrication in which erase and select gates are positioned on opposite sides of stacked floating and control gates, with source regions in the substrate beneath the erase gates, bit line diffusions which are partially overlapped by select gates at the ends of the rows of the cells. The floating and control gates are self-aligned with each other, and the erase and select gates are split from but self-aligned with the stacked gates.

An erase path is formed between the floating gate and the channel region beneath it, and electron migration from the floating gate to the channel region is produced by Fowler-Nordheim tunneling due to high voltage coupling between the control, select and erase gates and the floating gate. Programming is done by hot carrier injection from an off-gate channel region to the floating gate due to high voltage coupling between the control gate, erase gate and source region and the floating gate. The array is biased so that all of the memory cells in it can be erased simultaneously, while programming is bit selectable.

DETAILED DESCRIPTION

Figure 1:
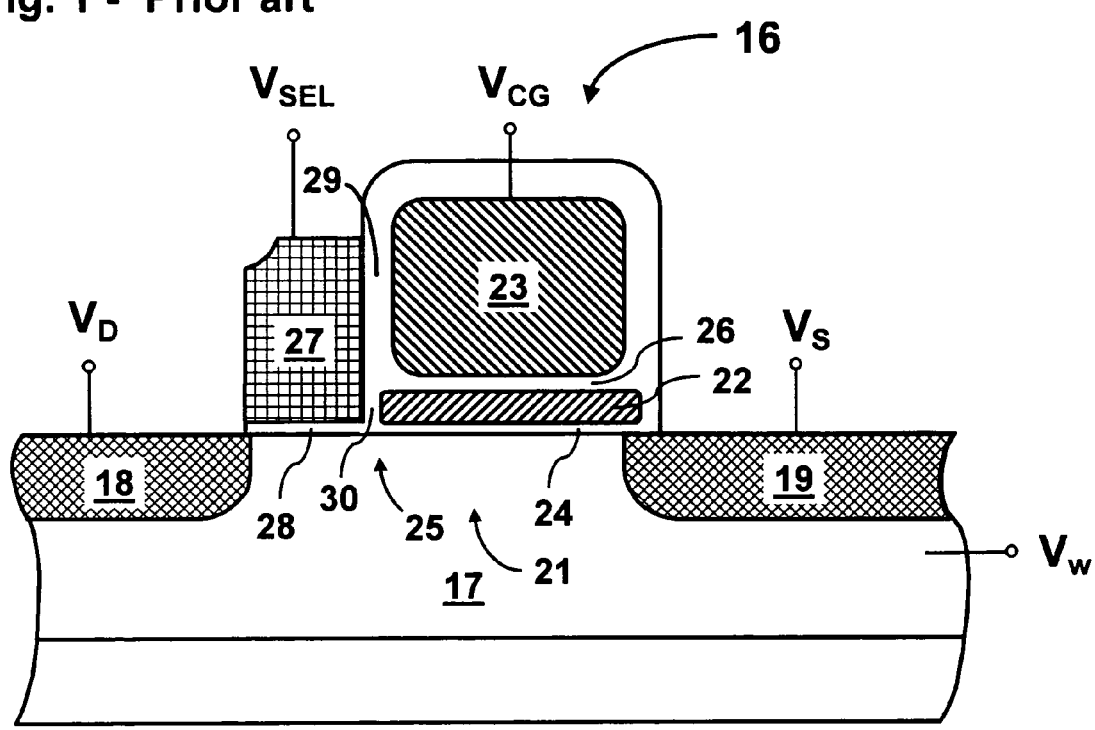
FIG. 1 is a cross-sectional view of a self-aligned split-gate flash memory cell of the prior art.
Figure 2:
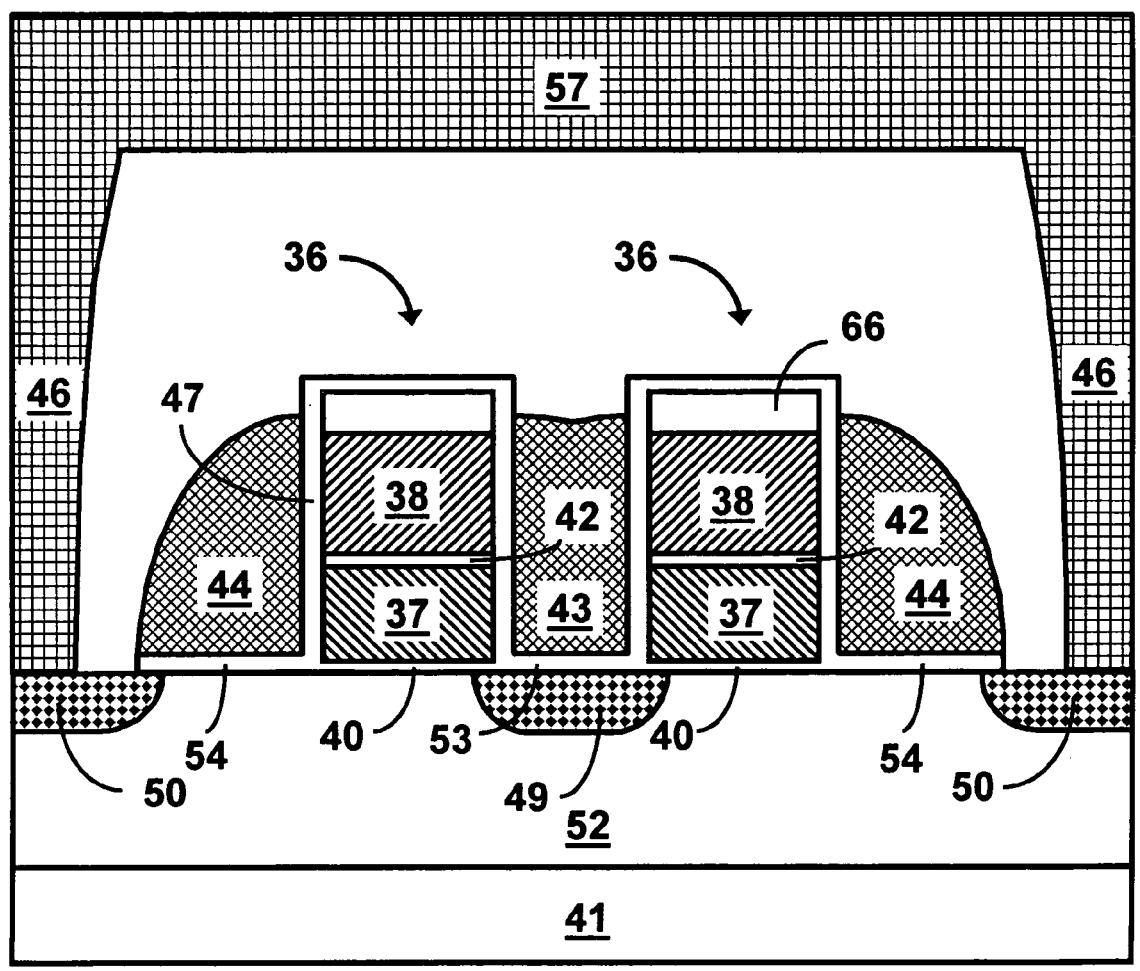
FIG. 2 is a cross-sectional view, taken along line 2—2 in FIG. 3, of one embodiment of a self-aligned split-gate flash memory cell array incorporating the invention.
Figure 3:
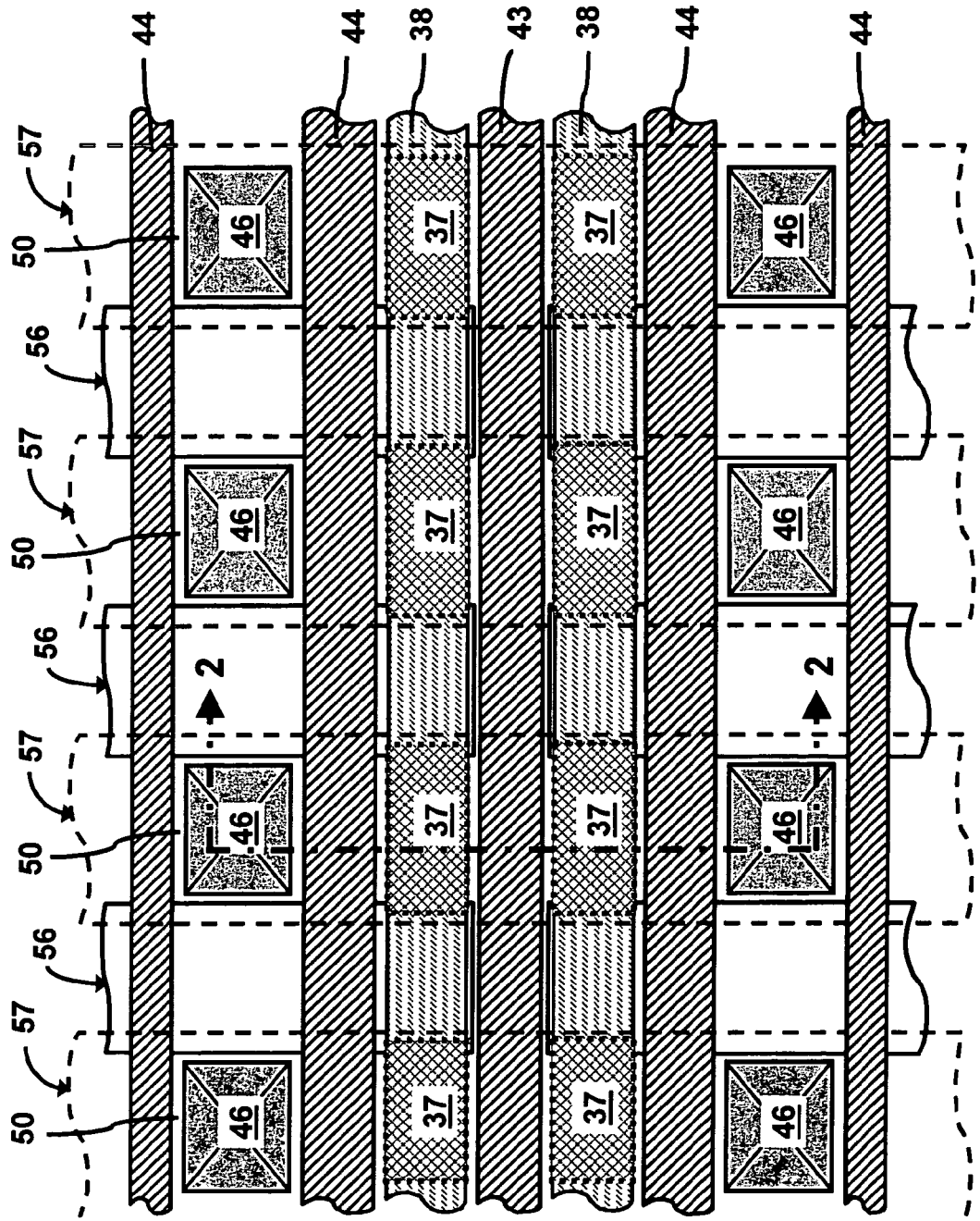
FIG. 3 is a top plan view of the embodiment of FIG. 2.

As illustrated in FIGS. 2 and 3, the memory includes an array of self-aligned split-gate flash memory cells 36, each of which has stacked floating and control gates 37, 38. The control gates are positioned above and in vertical alignment with the floating gates.

Erase gates 43 and select gates 44 are positioned on opposite sides of the stacked gates. In the embodiment illustrated, there are two cells in each row, and erase gate 43 is positioned between the stacked gates, with select gates 44 on the outer sides of the stacked gates at the ends of the rows. The erase gates and select gates thus alternate between successive pairs of stacked gates, with the gates at the ends of the rows being select gates regardless of the number of cells in the rows.

An oxide layer 40 separates the floating gates from the substrate 41 below, and an inter-poly dielectric 42 is provided between the floating gates and the control gates. A dielectric 47 extends between the side walls of the floating and control gates and the erase and select gates.

A common source diffusion 49 is formed in an N-type well 52 in the upper portion of substrate 41 beneath erase gate 42, with the inner edge portions of floating gates 37 overlapping the outer edge portions of the source diffusion. Bit line diffusions 50 are formed in the P-type well at the ends of the rows and lie partially beneath the outer edge portions of select gates 44. Dielectric layers 53, 54 separate the erase gates and the select gates from the substrate.

A bit line 57 is connected to the bit line diffusions at the two ends of the row by bit line contacts 46.

As best seen in FIG. 3, isolation regions 56 are formed in the substrate between rows of cells, and control gates 38 cross over floating gates 37 and the isolation regions. Erase gates 43 and select gates 44 extend in a direction parallel to the control gates. Bit lines 57 are perpendicular to the erase, select and control gates, and cross over the bit lines contact 46, erase gate, select gates, and stacked gates in each row of the array. Erase paths extend from the floating gates through tunnel oxides 40 to the channel regions beneath.

A preferred process of fabricating the embodiment of FIGS. 2–3 is illustrated in FIGS. 4A–4E. In this process, oxide layer 40 is thermally grown to a thickness of about 60 Å to 120 Å on a monocrystalline silicon substrate which, in the embodiment illustrated, is in the form of a P-type substrate 41 in which P-type well 52 is formed. Alternatively, if desired, an N-type well can be formed in the P-type substrate, in which case the P-type well will be formed in the N-type well.

A conductive layer 62 of polysilicon or amorphous silicon (poly-1) is deposited on the thermal oxide to a thickness on the order of 300 Å to 1500 Å, and etched to form rows of stripes of silicon which coincide with the rows of cells to be formed on the substrate. The inter-poly dielectric layer 42 is formed on the silicon. The silicon is preferably doped with phosphorus, arsenic or boron to a level on the order of $10^{17}$ to $10^{20}$ per cm$^3$. The doping can be done in-situ during deposition of the silicon or by ion implantation either directly into the silicon or through the dielectric 42 above it. The inter-poly dielectric can be either a pure oxide or a combination of oxide, nitride and oxide (ONO), and in the embodiment illustrated, it consists of a lower oxide layer having a thickness on the order of 30 Å–100 Å, a central nitride layer having a thickness on the order of 60 Å–200 Å, and an upper oxide layer having a thickness on the order of 30 Å–100 Å.

A second layer 63 of polysilicon (poly-2) is deposited on dielectric film 42. This layer has a thickness on the order of 1500 Å–3500 Å, and is doped with phosphorus, arsenic or boron to a level on the order of $10^{20}$ to $10^{21}$ per cm$^3$. A CVD oxide or nitride layer 66 having a thickness on the order of 300 Å–1000 Å is deposited on the poly-2 layer, and is used as a mask to prevent the poly-2 material from etching away during subsequent dry etching steps.

Figure 4A:
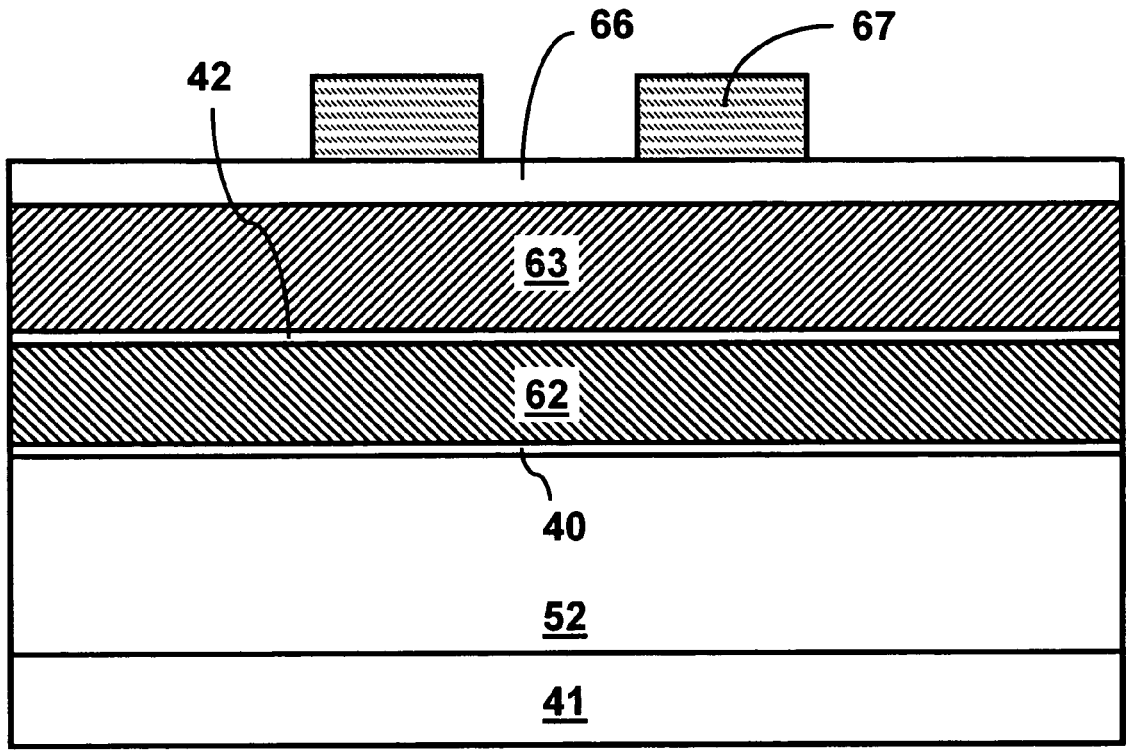
FIGS. 4A–4E are schematic cross-sectional views illustrating the steps in one embodiment of a process for fabricating a self-aligned split-gate flash memory cell array in accordance with the invention.
Figure 4B:
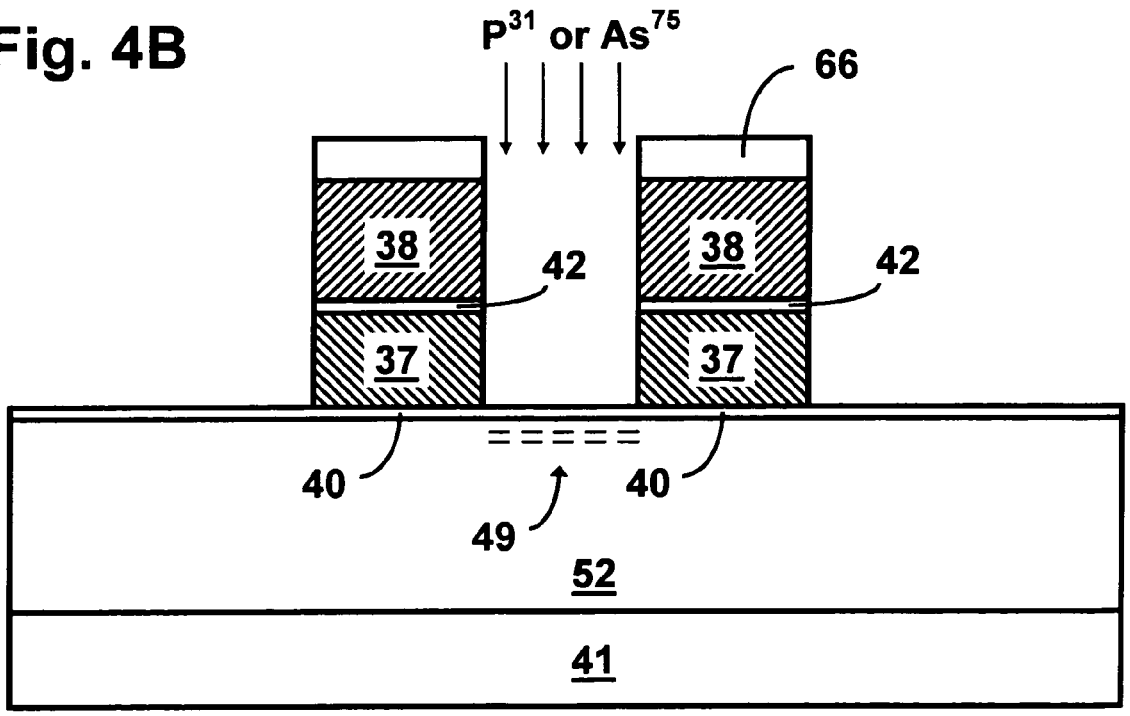

A photolithographic mask 67 is formed over layer 66 to define the control gates, and the unmasked portions of that layer and poly-2 layer 63 are etched away anisotropically, leaving only the portions of the poly-2 which form the control gates 38. The control gates extend in a direction perpendicular to the rows of silicon in the poly-1 layer. The exposed portions of the inter-poly dielectric 42 and the underlying portions of the poly-1 layer 62 are then etched away anisotropically to form the floating gates 37, as illustrated in FIG. 4B. Thereafter, common source diffusion region 49 is formed in the substrate between the stack gates by ion implantation using dopants such as $P^{31}$ or $As^{75}$.

Figure 4C:
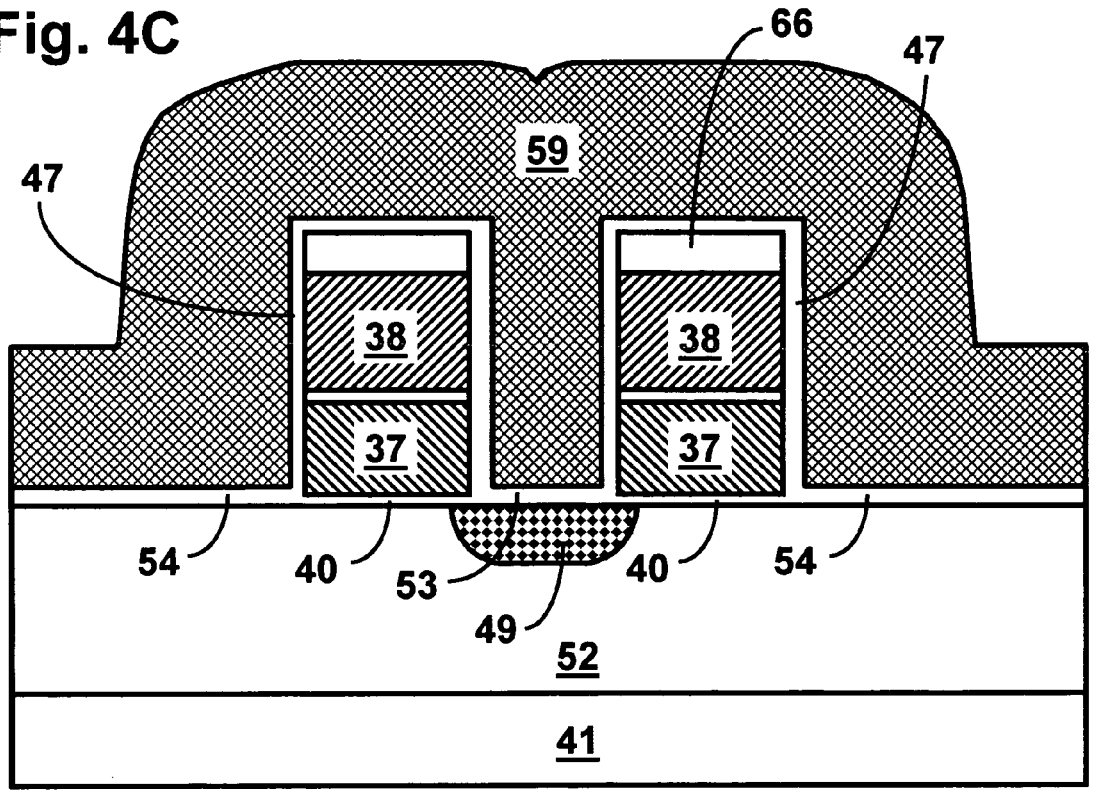

Following ion implantation, dielectric 47 is formed on the sidewalls of control and floating gates, dielectric 53 is formed on common source diffusion 49, dielectric 54 is formed on silicon substrate, and a conductive (poly-3) layer 59 is deposited over the entire wafer, as shown in FIG. 4C. Dielectric films 47, 53, 54 can be either pure oxide or the combination of oxide, nitride and oxide (ONO), and in the embodiment illustrated, they each consist of a lower oxide layer having a thickness on the order of 30 Å–100 Å, a central nitride layer having a thickness on the order of 60 Å–300 Å, and an upper oxide layer having a thickness on the order of 30 Å–100 Å. The poly-3 layer is typically doped polysilicon or polycide, and is deposited to a thickness on the order of 1500 Å–3000 Å.

Figure 4D:
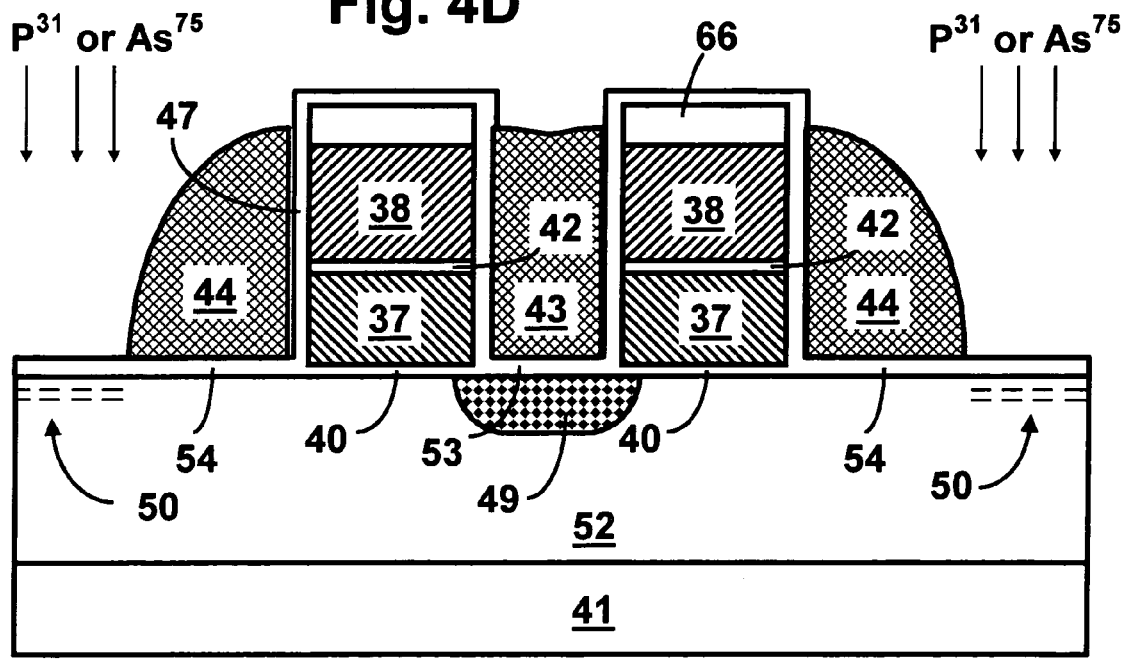

The poly-3 layer is then etched anisotropically to form select gates 44 and erase gate 43, as illustrated in FIG. 4D. Being formed in this manner, the select and erase gates are self-aligned with and parallel to the control gates. N-type dopants such as $P^{31}$ or $As^{75}$ are implanted into P-well 52 to form the bit line diffusions 50.

Figure 4E:
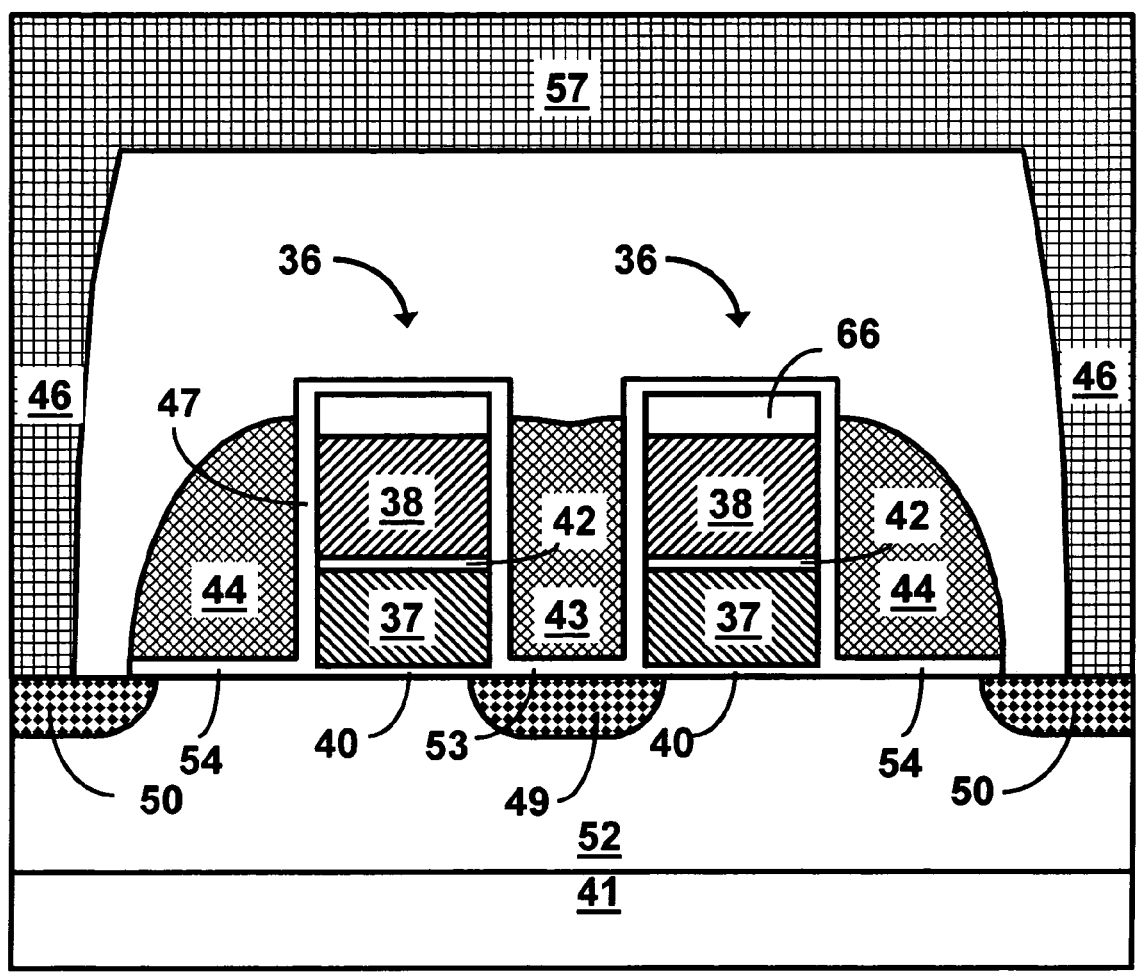

Thereafter, a glass material 60 such as phosphosilicate glass (PSG) or borophosphosilicate glass (BPSG) is deposited across the entire wafer, then etched to form openings for bit line contacts 46, as shown in FIG. 4E. Finally, a metal layer is deposited over the glass and patterned to form bit lines 57 and bit line contacts 46.

Figure 5:
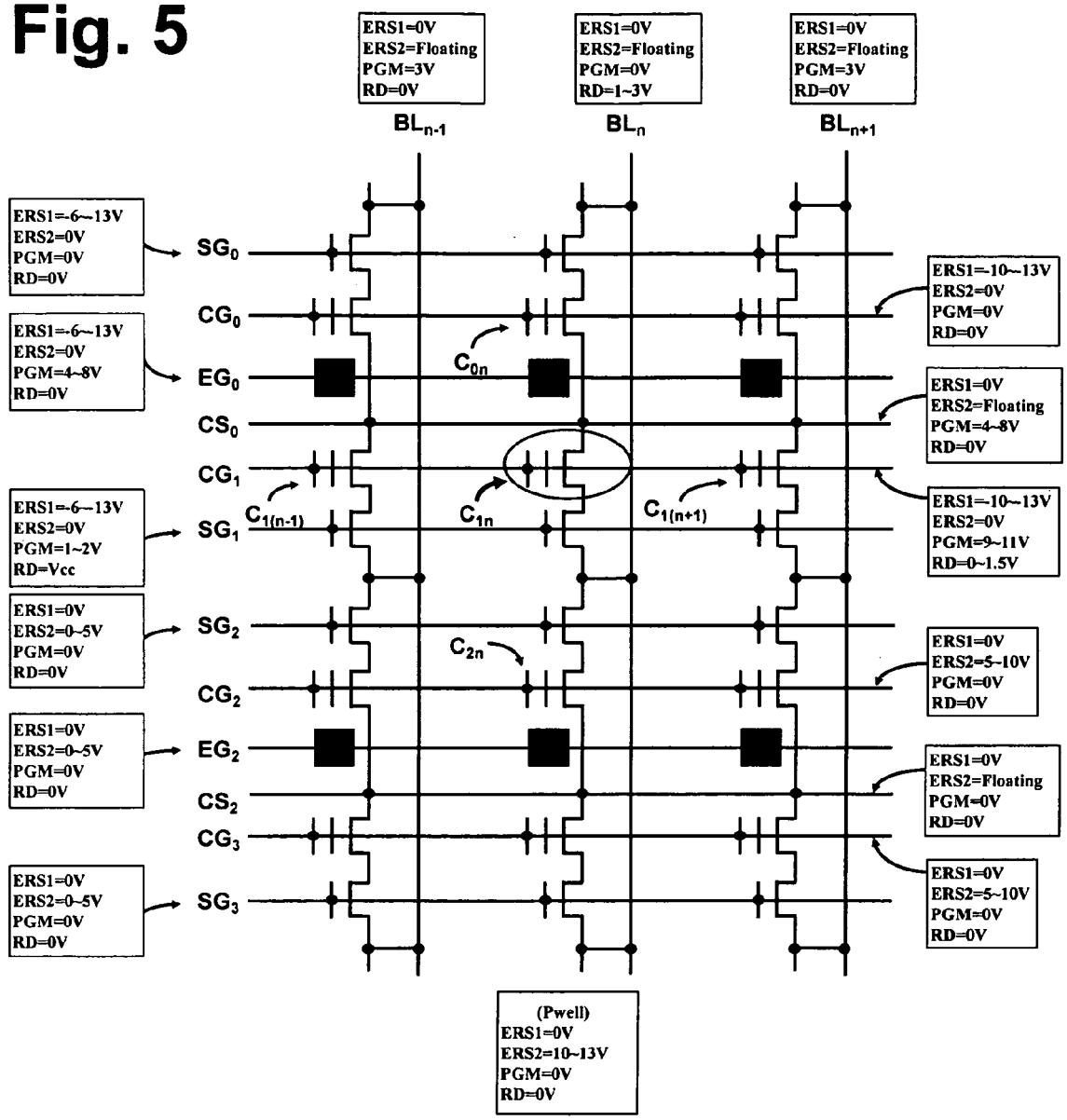
FIG. 5 is a circuit diagram of a small memory array as in the embodiment of FIG. 2, showing exemplary bias conditions for erase, program and read operations.

Operation and use of the memory array can now be described with reference to FIG. 5 where exemplary bias voltages for erase (ERS), program (PGM) and read (RD) operations are shown next to the terminals of the array. In this example, memory cell $C_{1n}$ is selected. This cell is located at the intersection of control gate $CG_1$ and bit line $BL_n$, and is circled on the drawing for ease of location. All of the other memory cells in the array are unselected.

During an erase operation, electrons are forced to tunnel from the floating gate to the channel region beneath it, leaving positive ions in the floating gate. This can be done with either of two different bias conditions. In the first erase mode (ERS1), control gates $CG_0$–$CG_1$ are biased at a level on the order of −10 to −13 volts, select gates $SG_0$–$SG_1$ and erase gate $EG_0$ are biased at −6 to −13 volts, and the bit line, common source and P-well are biased at 0 volts. In the second erase mode (ERS2), the control, erase and select gates are biased at 0 volts, bit line and common source are floating, and the P-well is biased at 10 to 13 volts.

With these bias conditions, most of the voltages applied to the control gate, the select gate and the erase gate appear across the tunnel oxide under the floating gate. That triggers Fowler-Nordheim tunneling, with electrons tunneling from the floating gate to the channel region below. As the floating gate becomes more positively charged, the threshold voltage of the memory cell, which is preferably on the order of −2 to −5 volts in this embodiment, becomes lower. This results in an inversion layer in the channel beneath the floating gate when the control gate is biased at 0–1.5 volts. Therefore, the memory cell goes into the conductive state (logic "1") after the erase operation.

In the first erase mode, the control gates, the select gates and the erase gates in the unselected memory cells are biased at 0 volts, so there is no Fowler-Nordheim tunneling in them. In the second erase mode, in the unselected memory cells, the control gates are biased at 5 to 10 volts, the select gates and the erase gates are biased at 0 to 5 volts, the voltage across the tunnel oxide is greatly reduced and there is no Fowler-Nordheim tunneling.

With the control gate, select gate and erase gate surrounding the floating gate or cathode electrode, the capacitance between the gates is relatively large, and high-voltage coupling from these gates to the floating gate is substantially enhanced. That significantly reduces the voltage required for Fowler-Nordheim tunneling, and also makes it possible to use a thicker tunnel oxide while still maintaining sufficient electron tunneling.

During a program operation, the control gate of the selected memory cell $C_{1n}$ is biased to a level of 9 to 11 volts, the select gate $SG_1$ is biased at 1–2 volts, the erase gates $EG_0$ is biased at 4–8 volts, the common source $CS_0$ is biased at 4–8 volts, the bit line is biased at 0 volts, and P-well is held at 0 volts. With these bias conditions, most of the voltage between the common source and the bit line appears across the mid-channel region between select gate $SG_1$ and the floating gate of the selected cell $C_{1n}$, resulting in a high electric field in that region. In addition, since the floating gate is coupled to a high voltage from the control gate, erase gate and common source, a strong vertical electric field is established across the oxide between the mid-channel region and the floating gate. When electrons flow from the bit line to the common source, they are accelerated by the electric field across the mid-channel region, and some of them become heated. Some of the hot electrons get accelerated by the vertical field, which causes them to overcome the energy barrier of the oxide (about 3.1 eV) and inject into the floating gate.

At the end of the program operation, the floating gate is negatively charged, and the threshold voltage of the memory cell, which preferably is on the order of 3–5 volts, becomes higher. Thus, the memory cell is turned off when the control gate is biased at 0 volts during a read operation. Following a program operation, the memory cell goes into a non-conductive state (logic "0").

In the unselected memory cells $C_{1(n-1)}$ and $C_{1(n+1)}$ which share the same control gate with the selected cell $C_{1n}$, the bit line is biased at 3 volts, the select gate $SG_1$ is at 1–2 volts, and the control gate is at 9–11 volts. Thus, select transistors $S_{1(n-1)}$ and $S_{1(n+1)}$ are turned off, and there is no mid-channel hot carrier injection in cells $C_{1(n-1)}$ and $C_{1(n+1)}$. For the unselected memory cells such as $C_{0n}$ and $C_{2n}$ in the selected bit line, the control gates and select gates are biased at 0 volts, the bit line is biased at 0 volts, which minimizes the mid-channel hot carrier injection, and the floating gate charges are unchanged.

The control gates, the erase gates, and the common source nodes surround the floating gates in a manner which provides relatively large inter-gate and common source to floating gate capacitances for high-voltage coupling during program operation.

In the read mode, the control gate of the selected memory cell $C_{1n}$ is biased at 0–1.5 volts, the common source is biased to 0 volt, 1–3 volts is applied to the bit line, Vcc is applied to the select gate $SG_1$, and 0 volts is applied to the erase gate $EG_0$. When the memory cell is erased, the read shows a conductive state because the channel of selected cell is turned on. Thus, a logic "1" is returned by the sense amplifier. When the memory cell is programmed, the read shows a non-conductive state because the channel of the selected cell is turned off, and hence the sense amplifier returns logic "0".

In the unselected memory cells $C_{0n}$ and $C_{2n}$ in the selected bit line, the control gates and select gates are biased at 0 volts, and there is no current flow between the bit line and common source nodes. In the unselected memory cells $C_{1(n-1)}$ and $C_{1(n+1)}$, both the bit line and common source nodes are biased at 0 volts, and there is no current flow between the bit line and the common source nodes.

The invention has a number of important features and advantages. It provides a self-aligned split-gate flash memory cell array which has enhanced high voltage coupling from the control gate, select gate and erase gate to the floating gate for erase operations, and from the control gate, erase gate and common source to the floating gate for program operations. Each cell has control and floating gates which are stacked and self-aligned with each other, and select and erase gates which are split from but self-aligned with the other two. With this enhanced coupling, the high voltage required for erase operation can be greatly reduced. Moreover, the memory cells can be made smaller, and the cell density can be greater than in memory structures heretofore provided.

The erase gates have heavily doped diffusion regions beneath them, but the select gates do not. The erase path is from the floating gate to the channel region beneath it, with Fowler-Nordheim tunneling, the program path is from the off-gate channel region to the floating gate near it, using hot carrier injection, and the array is biased so that all of the memory cells in the array can be erased simultaneously, while programming is bit selectable.

It is apparent from the foregoing that a new and improved self-aligned split-gate flash memory and process of fabrication have been provided. While only certain presently preferred embodiment has been described in detail, as will be apparent to those familiar with the art, certain changes and modifications can be made without departing from the scope of the invention as defined by the following claims.

The invention claimed is:

1. A flash memory cell array, comprising: a substrate having an active area, a plurality of vertically stacked pairs of floating gates and control gates arranged in rows above the active area, with the control gates being positioned above and aligned with the floating gates, select and erase gates aligned with and positioned on opposite sides of each of the stacked gates, a bit line above each row, bit line diffusions in the active area between and partially overlapped by two select gates, a bit line contact interconnecting the bit line and the bit line diffusions in each row, and a common source region in the active area beneath the erase gate and partially overlapped by the floating gates.

2. The flash memory cell array of claim 1 including a relatively thin tunnel oxide between the floating gates and the substrate, a first relatively thick dielectric between the floating gates and the select and erase gates, and a second relatively thick dielectric between floating gates and control gates.

3. The flash memory cell array of claim 1 wherein the control gates, select gates and erase gates surround the floating gates in a manner which provides a relatively large inter-gate capacitance for high-voltage coupling during an erase operation.

4. The flash memory cell array of claim 1 wherein the control gates, the erase gates, and the common source regions surround the floating gates in a manner which provides relatively large inter-gate and common source to floating gate capacitance for high-voltage coupling during program operation.

5. The flash memory cell array of claim 1 wherein erase paths extend from the floating gates, through the tunnel oxide to the channel regions, and high voltage is coupled to the floating gates from the control gates, the select gates and the erase gates.

6. The flash memory cell array of claim 1 wherein program paths extend from off-gate channel regions between the select gates and the floating gates to the floating gates, and high voltage is coupled to the floating gates from the control gates, the erase gates on the sides of the stacked gates, and the common source regions.

7. The flash memory cell array of claim 1 wherein the bit line for a row containing a selected cell to be programmed is held at 0–0.8 volt, a relatively low positive voltage is applied to a cell select gate for the selected cell, a relatively high positive voltage is applied to the source region, a relatively high positive voltage is applied to the erase gates, and a relatively high positive voltage is applied to the control gate in the selected cell.

8. The flash memory cell array of claim 1 wherein an erase path is formed by applying a relatively high negative voltage to the control gates and a relatively low negative voltage to the select and erase gates, with the bit line diffusions, the source region and the active area at 0 volts.

9. The flash memory cell array of claim 1 wherein an erase path is formed by applying a relatively low positive voltage to the control gates, the select gates and the erase gates, with the active area at a relatively high positive voltage and the bit line and source regions floating.

10. The flash memory cell array of claim 1 wherein a read path is formed with the common source at 0 volts, the bit line diffusion at 1–3 volts, the erase gates at near zero voltage, the select gates at relatively high positive voltage, and the control gate of a selected cell is biased at 0–2 volts to form a conduction channel under the floating gate for an erase state and a non-conduction channel for a program state.

11. The flash memory cell array of claim 1 including an erase path which can erase the whole cell array simultaneously and a program path which is single cell selectable.

12. A flash memory cell, comprising: a substrate having an active area, a vertically stacked pairs of floating gate and control gate above the active area, with the control gate being positioned above and aligned with the floating gate, select and erase gates aligned with and positioned on opposite sides of the stacked gates, a source region in the active area underneath the erase gate and partially overlapped by the floating gate, a bit line extending above the gates, a bit line diffusion in the active area partially overlapped by the select gate, and a bit line contact interconnecting the bit line and the bit line diffusion.

13. The flash memory cell of claim 12 including a relatively thin tunnel oxide between the floating gate and the substrate, a first relatively thick dielectric between the floating gate and the select and erase gates, and a second relatively thick dielectric between the floating gate and the control gate.

14. The flash memory cell of claim 12 wherein the control gate, the select gate and the erase gate surround the floating gate in a manner which provides a relatively large inter-gate capacitance for high-voltage coupling during an erase operation.

15. The flash memory cell of claim 12 wherein the control gate, the erase gate, and the source region surround the floating gate in a manner which provides a relatively large inter-gate and source to floating gate capacitance for high-voltage coupling during a program operation.

16. The flash memory cell of claim 16 wherein an erase path extends from the floating gate, through the tunnel oxide to the channel region, and high voltage is coupled to the floating gate from the control gate, the select gate and the erase gate.

17. The flash memory cell of claim 12 wherein a program path extends to the floating gate from an off-gate channel region between the select gate and the floating gate, and high voltage is coupled to the floating gate from the control gate, the erase gate, and the source region.

18. The flash memory cell of claim 12 wherein a program path is formed by applying 0–0.8 volt to the bit line diffusions, a relatively low positive voltage to the select gate, a relatively high positive voltage to the source region, a relatively high positive voltage to the erase gate, and a relatively high positive voltage to the control gate.

19. The flash memory cell of claim 12 wherein an erase path is formed by applying a relatively high negative voltage to the control gate and a relatively low negative voltage to the select and erase gates, with the bit line diffusion, the source region and the active at 0 volts.

20. The flash memory cell of claim 12 wherein an erase path is formed by applying a relatively low positive voltage to the control gate, the select gate and the erase gate, with the active area at a relatively high positive voltage and the bit line and source regions floating.

21. The flash memory cell of claim 12 wherein a read path is formed with the source region at 0 volts, the bit line diffusion at 1–3 volts, the erase gate near 0 volts, the select gate at relatively high positive voltage, and the control gate at 0–2 volts to form a conduction channel under the floating gate for an erase state and a non-conduction channel for a program state.

* * * * *